US007755256B2

(12) United States Patent
Shibamoto et al.

(10) Patent No.: US 7,755,256 B2
(45) Date of Patent: Jul. 13, 2010

(54) ULTRASONIC DIAGNOSTIC APPARATUS AND ULTRASONIC PROBE

(75) Inventors: Koichi Shibamoto, Tochigi-ken (JP); Minoru Aoki, Tochigi-ken (JP); Yasuhisa Makita, Tochigi-ken (JP); Takashi Takeuchi, Tochigi-ken (JP); Hiroyuki Shikata, Tochigi-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/556,629

(22) Filed: Nov. 3, 2006

(65) Prior Publication Data

US 2007/0108872 A1 May 17, 2007

(30) Foreign Application Priority Data

Nov. 4, 2005 (JP) .......................... P2005-320995

(51) Int. Cl.
*H01L 41/08* (2006.01)

(52) U.S. Cl. ...................................... 310/334; 310/336

(58) Field of Classification Search ................. 310/327, 310/334–337
See application file for complete search history.

(56) References Cited

U.S. PATENT DOCUMENTS 4,348,904 A * 9/1982 Bautista, Jr. ................. 73/644
5,974,884 A * 11/1999 Sano et al. .................... 73/589
6,258,034 B1 * 7/2001 Hanafy ....................... 600/459
6,607,491 B2 * 8/2003 Sato .......................... 600/459
7,022,081 B2 * 4/2006 Oliver ........................ 600/459
7,224,104 B2 * 5/2007 Shibamoto et al. .......... 310/335

FOREIGN PATENT DOCUMENTS

JP 7-390 1/1995
JP 11-89835 4/2004

* cited by examiner

*Primary Examiner*—Mark Budd
(74) *Attorney, Agent, or Firm*—Oblon, Spivak, McClelland, Maier & Neustadt, L.L.P.

(57) ABSTRACT

An ultrasonic probe including a piezoelectric vibrator configured to transmit and receive ultrasonic waves, an acoustic lens configured to focus the ultrasonic waves and an acoustic matching layer arranged between the piezoelectric vibrator and the acoustic lens and configured to modify acoustic impedance from the piezoelectric vibrator to the acoustic lens. The acoustic matching layer includes a first region arranged at center areas along a direction of transmitting and receiving of the ultrasonic waves, a second region arranged between the first region and the piezoelectric vibrator and having a rate of change of acoustic impedance which is less than rate of change of acoustic impedance of the first region and a third region arranged between the first region and the acoustic lens, and having a rate of change of acoustic impedance which is less than a rate of change of acoustic impedance of the first region.

15 Claims, 14 Drawing Sheets

(a)

(b)

(c)

ULTRASONIC DIAGNOSTIC APPARATUS AND ULTRASONIC PROBE

CROSS-REFERENCE TO RELATED APPLICATIONS

This application is based upon and claims the benefit of priority from the prior Japanese Patent Application No. 2005-320995, filed on Nov. 4, 2005, the entire contents of which are incorporated herein by reference.

BACKGROUND OF THE INVENTION

An ultrasonic diagnostic apparatus is a diagnostic imaging apparatus that provides images inside of a subject on the basis of reflected ultrasonic waves by transmitting ultrasonic waves from an ultrasonic probe to a subject, and receiving reflected waves from regions of discordant acoustic impedance by the ultrasonic probe.

In a known ultrasound imaging device, a plurality of acoustic matching layers having thicknesses of less than a quarter of ultrasonic wave length are layered between a piezoelectric vibrator and an acoustic lens. This technique is intended to match the acoustic impedance of a piezoelectric vibrator to the acoustic impedance of the acoustic lens. Many matching layers result in acoustic matching between the piezoelectric vibrator and the acoustic lens. This technique thus contributes to a wider frequency bandwidth of ultrasonic waves transmitted and received and higher sensitivity for detecting ultrasonic waves.

At a same time, there exists a technique for making matching layers having slope characteristics of acoustic impedance. By this technique, a discontinuous part in the impedance characteristic of a matching layer disappears by matching the acoustic impedance of a piezoelectric vibrator to that of an acoustic lens without a break. This technique improves propagation efficiency of ultrasonic waves.

One concrete method of forming the matching layer is to evaporate at least two materials, while gradually changing the ratio of the two materials. (For example, see JP07-390A.) As another concrete method, a matching layer formed by arranging cone state materials and plastic filled between the cone state materials. This matching layer also has slope characteristics of acoustic impedance. (For example, see JP11-89835A.)

By virtue of this slope matching technique, because of nonexistence of a impedance discontinuity, it is expected that a reduction of reflecting loss, resulting in improved transmitting and receiving efficiency and wider bandwidth of ultrasonic wave, can be realized in comparison with the case of using two or three matching layers.

However, the slope matching layers of the prior art also have discontinuous faces. At a boundary face between an acoustic matching layer and an acoustic lens and a boundary face between an acoustic matching layer and a piezoelectric vibrator, the rate of change of acoustic impedance is discontinuous. In the following discussion, the discontinuous of rate of change is explained with reference to FIG. 14.

As shown in FIG. 14(*a*), acoustic impedance changes continuously from a piezoelectric vibrator to an acoustic lens. However, the rate of change of acoustic impedance is discontinuous at a boundary interface between an acoustic matching layer and an acoustic lens and a boundary face between an acoustic matching layer and a piezoelectric vibrator.

In consequence, this discontinuous interface causes generation of reflection from the boundary, which leads to a loss of ultrasonic wave and deters image diagnostics.

BRIEF SUMMARY OF THE INVENTION

According to one aspect of the present invention, there is provided an ultrasonic apparatus diagnostic and an ultrasonic probe in which efficiency of propagation of ultrasonic waves is improved.

According to another aspect of the present invention there is provided an ultrasonic probe including a piezoelectric vibrator configured to transmit and receive ultrasonic waves, an acoustic lens configured to focus the ultrasonic waves, and an acoustic matching layer arranged between the piezoelectric vibrator and the acoustic lens and configured to modify acoustic impedance from the piezoelectric vibrator to the acoustic lens, wherein the acoustic matching layer includes a first region arranged at center areas along a direction of transmitting and receiving of the ultrasonic waves, a second region arranged between the first region and the piezoelectric vibrator and in which a rate of change of acoustic impedance is less than a rate of change of acoustic impedance of the first region, and a third region arranged between the first region and the acoustic lens and in which a rate of change of acoustic impedance is less than a rate of change of acoustic impedance of the first region.

According to a further aspect of the present invention there is provided an ultrasonic probe including a piezoelectric vibrator configured to transmit and receive ultrasonic waves, an acoustic lens configured to focus the ultrasonic waves, an acoustic matching layer arranged between the piezoelectric vibrator and the acoustic lens and configured to modify acoustic impedance from the piezoelectric vibrator to the acoustic lens; wherein the piezoelectric vibrator, the acoustic lens and the acoustic matching layer are configured so that acoustic impedance of the piezoelectric vibrator, the acoustic lens and the acoustic matching layer changes in accordance with a continuously differentiable function along a direction of transmitting and receiving of the ultrasonic waves.

According to a further aspect of the present invention there is provided an ultrasonic probe including a piezoelectric vibrator configured to transmit and receive ultrasonic waves, an acoustic lens configured to focus the ultrasonic waves, and an acoustic matching layer arranged between the piezoelectric vibrator and the acoustic lens and configured to modify acoustic impedance from the piezoelectric vibrator to the acoustic lens, wherein the acoustic matching layer has thickness along a direction of transmitting and receiving of the ultrasonic waves larger than an average wavelength of ultrasonic waves propagating in the acoustic matching layer.

According to a further aspect of the present invention there is provided an ultrasonic diagnostic apparatus including an ultrasonic probe configured to transmit and receive ultrasonic waves toward and from a subject, a transmitting and receiving circuit configured to generate reception signals on the basis of reflected signals received by the ultrasonic probe and an image generation unit configured to generate an image related to the subject on the basis of reception signals generated by the transmitting and receiving circuit, wherein the ultrasonic probe includes a piezoelectric vibrator configured to transmit and receive ultrasonic waves, an acoustic lens configured to focus the ultrasonic waves, and an acoustic matching layer arranged between the piezoelectric vibrator and the acoustic lens and configured to modify acoustic impedance from the piezoelectric vibrator to the acoustic lens, wherein the acoustic matching layer including a first region arranged at center areas along a direction of transmitting and receiving of the ultrasonic waves, a second region arranged between the first region and the piezoelectric vibrator and in which a rate of change of acoustic impedance is less than a rate of change of acoustic impedance of the first region, and a third region arranged between the first region and the acoustic lens and in which a rate of change of acoustic impedance is less than a rate of change of acoustic impedance of the first region.

According to a further aspect of the present invention there is provided an ultrasonic diagnostic apparatus including an ultrasonic probe configured to transmit and receive ultrasonic waves toward and from a subject, a transmitting and receiving circuit configured to generate reception signals on the basis of reflected signals received by the ultrasonic probe, and an image generation unit configured to generate a image related to the subject on the basis of reception signals generated by the transmitting and receiving circuit, wherein the ultrasonic probe includes a piezoelectric vibrator configured to transmit and receive ultrasonic waves, an acoustic lens configured to focus the ultrasonic waves, and an acoustic matching layer arranged between the piezoelectric vibrator and the acoustic lens and configured to modify acoustic impedance from the piezoelectric vibrator to the acoustic lens, wherein the acoustic matching layer has a thickness along a direction of transmitting and receiving of the ultrasonic waves larger than an average wavelength of ultrasonic waves propagating in the acoustic matching layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
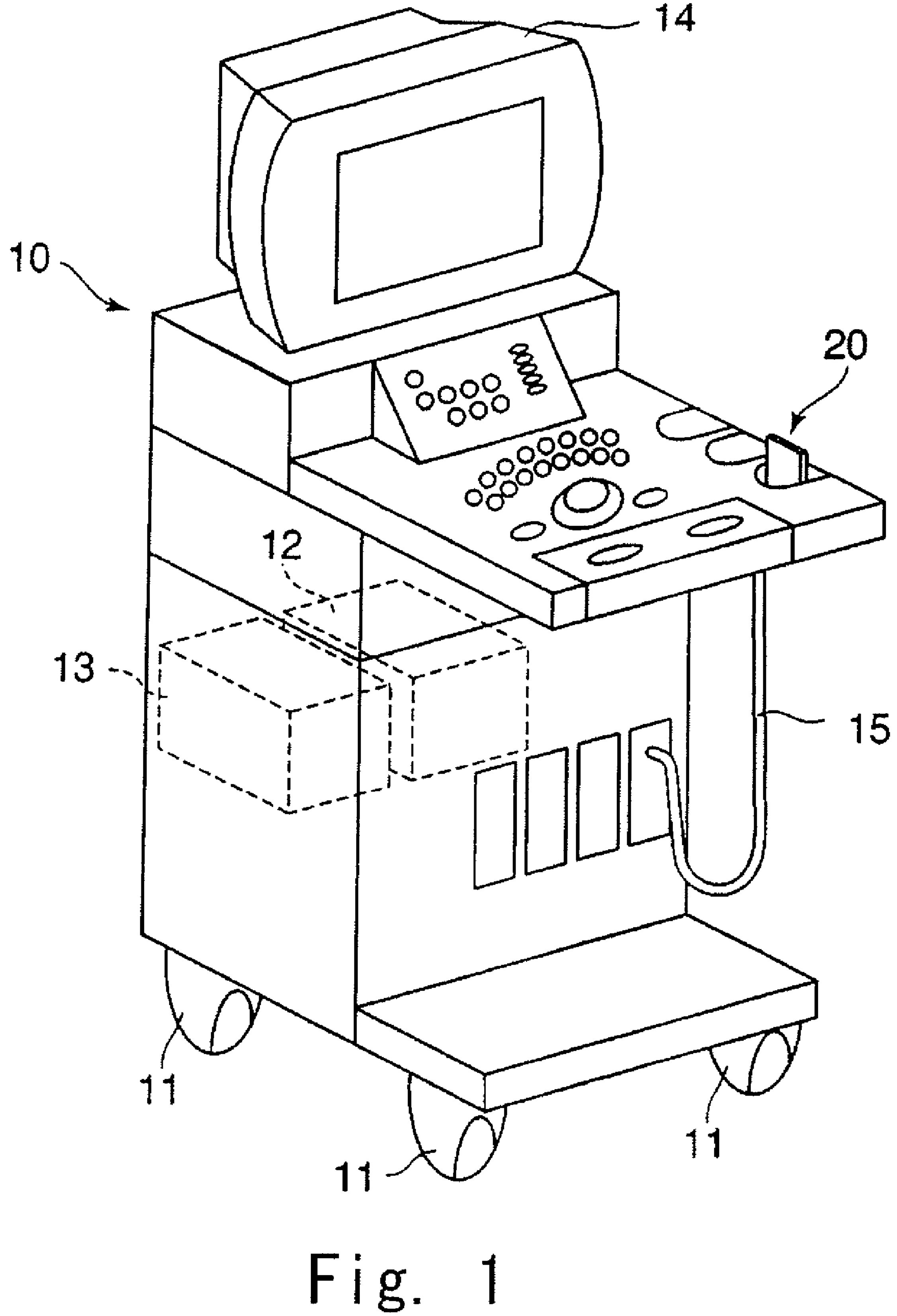
FIG. 1 is a perspective view of a first exemplary embodiment of the ultrasonic diagnostic apparatus of the invention.

Referring now to the drawings, wherein like reference numerals designate identical or corresponding parts throughout the several views, various embodiments of the present invention are next described.

First Exemplary Embodiment

As shown in FIG. 1, an ultrasonic diagnostic apparatus of a first exemplary embodiment includes an apparatus body 10 and an ultrasonic probe 20. A wheel 11 is fastened at the apparatus body 10 so that an operator can move it to bedside. A transmitting and receiving circuit 12 and an image generation unit 13 are set within the apparatus body 10. The transmitting and receiving circuit 12 applies driving signals to the ultrasonic probe 20 and generates a receiving signal based on echo signals obtained by the ultrasonic probe 20. An image generation unit 13 generates an ultrasonic image of the subject on the basis of the receiving signals generated by the transmitting and receiving circuit 12. On the apparatus body, there is provided a monitor 14 which displays an ultrasonic image generated by the image generation unit 13. The apparatus body 10 and the ultrasonic probe 20 are connected by a cable 15. Data is exchanged between the apparatus body 10 and the ultrasonic probe 20 over the cable 15.

Figure 2:
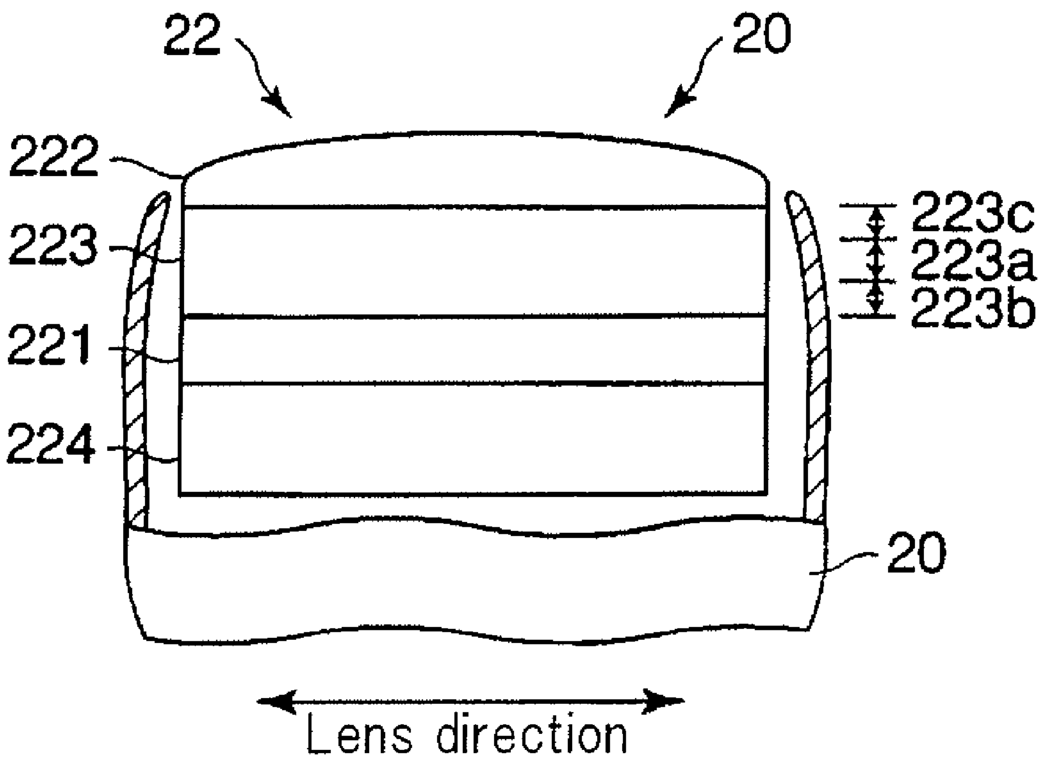
FIG. 2 is an elevation view of a transducer of the first exemplary embodiment

As shown in FIG. 2, the ultrasonic probe 20 includes a case 21 configured to be grabbed by an operator, a transducer 22 fastened in the case 20 and transmitting and receiving ultrasonic waves from a top portion of the ultrasonic probe 20 to the subject and a flexible substrate 23 fastened in the case 20 and transmitting and receiving electric signal to the transducers 22.

(Construction of the transducer 22)

Figure 3:
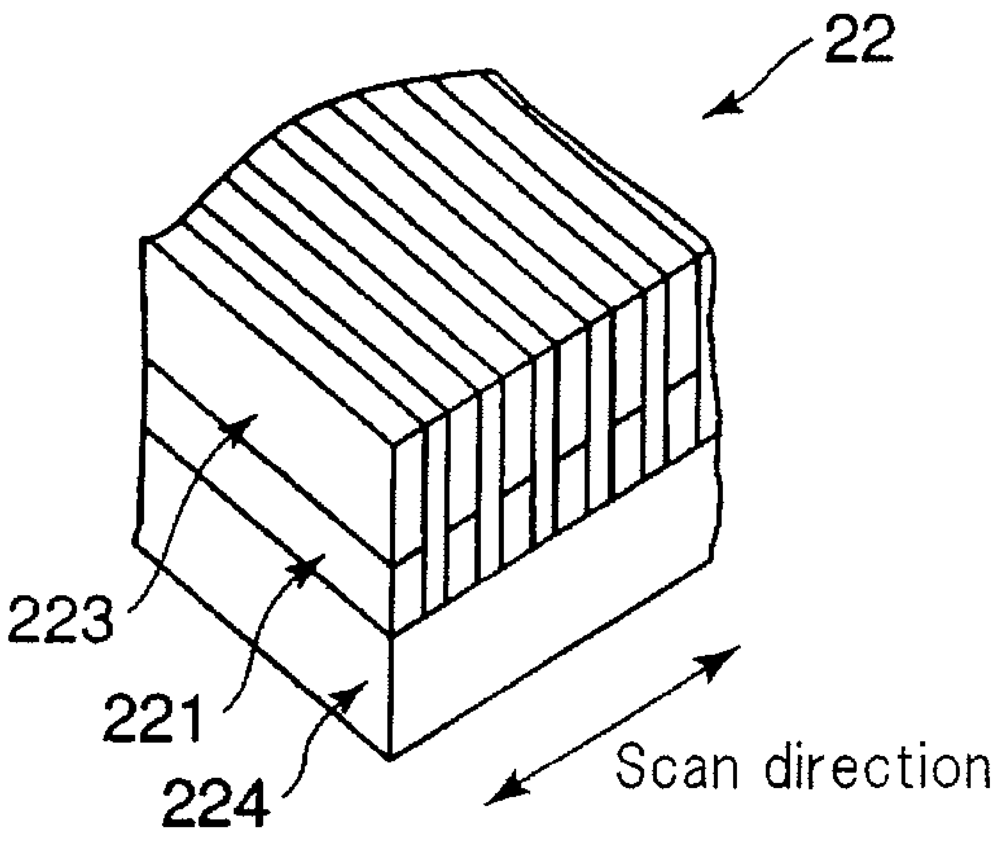
FIG. 3 is a perspective view of a part of the transducer of the first exemplary embodiment.

As shown in FIG. 3, the transducer 22 includes a piezoelectric vibrator 22 for transmitting and receiving ultrasonic waves, an acoustic lens 222 (see FIG. 2) for focusing ultrasonic wave transmitted from a piezoelectric vibrator 221, an acoustic matching layer 223 for matching acoustic impedance between the acoustic lens 222 and the piezoelectric vibrator 221 and a backing material 224 for absorbing ultrasonic waves transmitted from the piezoelectric vibrator in reverse back directions.

The piezoelectric transducer 221 is divided into a plurality of elements along a scan direction of ultrasonic waves. Each of the elements transmits and receives ultrasonic waves to the subject. Acoustic impedance of the piezoelectric vibrator 221 is about 32 Mraly. For example, the piezoelectric vibrator 221 is made from two component or three component piezoelectric ceramics. In each gap between one and another of the elements, plastic, for example epoxy, is filled.

The acoustic lens 222 is fastened on a front side of the acoustic matching layer 223, and has a curved surface in the portion contacting the subject for the purpose of acoustic focusing. The acoustic impedance of the acoustic lens 222 is near the value of acoustic impedance of the subject, about 1.5 Mraly, for preventing reflection of ultrasonic waves at contacting surfaces. For example, the acoustic lens 222 is made from silicon rubber.

The acoustic matching layer 223 is, like the piezoelectric vibrator 221, divided into a plurality of elements along a scan direction of ultrasonic waves. Each of the elements is configured to match acoustic impedance between the piezoelectric vibrator 221 and the acoustic lens 222. In each gap between one and another of the elements, plastic, for example epoxy is filled.

Next, components of the acoustic matching layer 223 are described in particular.

Figure 4:
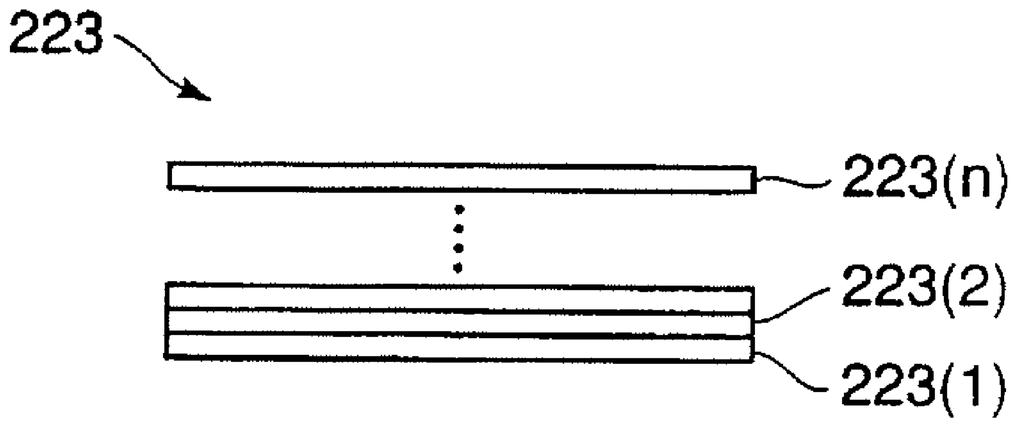
FIG. 4 is a further view of an acoustic matching layer of the first exemplary embodiment.

As shown in FIG. 4, the acoustic matching layer 223 includes a first acoustic matching layer 223(1), a second acoustic matching layer 223(2) . . . and a nth acoustic matching layer 223(n). Each of these first to nth matching layers 223(1) to 223(n) is a plastic film. The thickness of the plastic film is about one fortieth of the wavelength of the transmitted ultrasonic waves. For example, the plastic film is made from polypropylene plastic or polyethylene plastic. In FIG. 3, borderlines of the matching layers are drawn. However, practically, borderlines are not visible to the naked eye.

Each of the matching layers 223(1) to 223(n) includes filler. For example, the filler may be made from silica powder or tungsten powder.

An additive rate of filler depends on distance between the film and the piezoelectric vibrator 221, how many layers exist from the piezoelectric vibrator 221 to one plastic film. In this manner, acoustic impedance and rate of change of acoustic impedance is set as below mentioned.

Figure 5A:
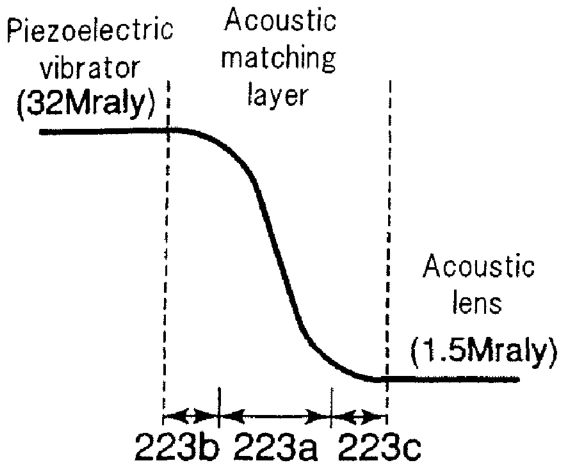
FIGS. 5(*a*) and 5(*b*) are schematic views of change of acoustic impedance from a piezoelectric vibrator toward an acoustic lens of the first exemplary embodiment.
Figure 5B:
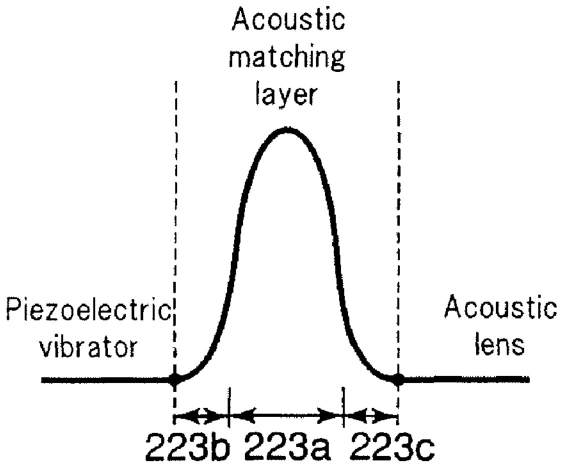

As shown in FIG. 5(*a*), acoustic impedance of the acoustic matching layer 223 decreases smoothly from the piezoelectric vibrator 221 toward the acoustic lens 222. At the end contacting the piezoelectric vibrator 221, the acoustic impedance is 32 Mraly, which is the same as the piezoelectric vibrator 221. At the end contacting the acoustic lens 222, the acoustic impedance is 1.5 Mraly, which is the same as the acoustic lens 222. The acoustic impedance of the first matching layer 223(1) contacting piezoelectric vibrator 221 is 32 Mraly. The acoustic impedance of the nth matching layer 223(n) contacting acoustic lens is 1.5 Mraly.

As shown in FIG. 5(*b*), the rate of change of acoustic impedance of the acoustic matching layer 223 is large at center areas the along thickness direction, and comes close to zero at the end areas along thickness direction. The rate of change of acoustic impedance is continuous at the border areas toward the piezoelectric vibrator 221 or the acoustic lens 222.

In other word, the acoustic matching layer 223 includes a first area 223*a* positioned at center areas along thickness direction, a second area 223*b* positioned between the piezoelectric vibrator 221 and the first area 223*a* and having a rate of change of acoustic impedance that is lower than the first area 223*a*, and a third area 223*c* positioned between the acoustic lens 222 and the first area 223*a* and having a rate of change of acoustic impedance that is lower than the first area 223*a*.

Thus, it is seen that the acoustic impedance of the transducers 22 is changed in accordance with a continuously differentiable function.

Next, thickness d of the acoustic matching layer 223 is considered in particular.

Thickness d of the acoustic matching layer 223 is set larger than the average wavelength of ultrasonic waves propagating in the acoustic matching layer 223. The average wavelength of ultrasonic waves depends on average sonic speed of acoustic matching layer 223 and the frequency of ultrasonic waves. In this exemplary embodiment, it is presupposed that the average sonic speed of acoustic matching layer 223 is the arithmetic average of sonic speed of the piezoelectric vibrator 221 and the sonic speed of acoustic lens 223.

By the way, the inventors have discovered that although an ultrasonic probe includes a slope matching layer, there are some cases that the frequency bandwidth of ultrasonic waves is narrower.

Figure 8:
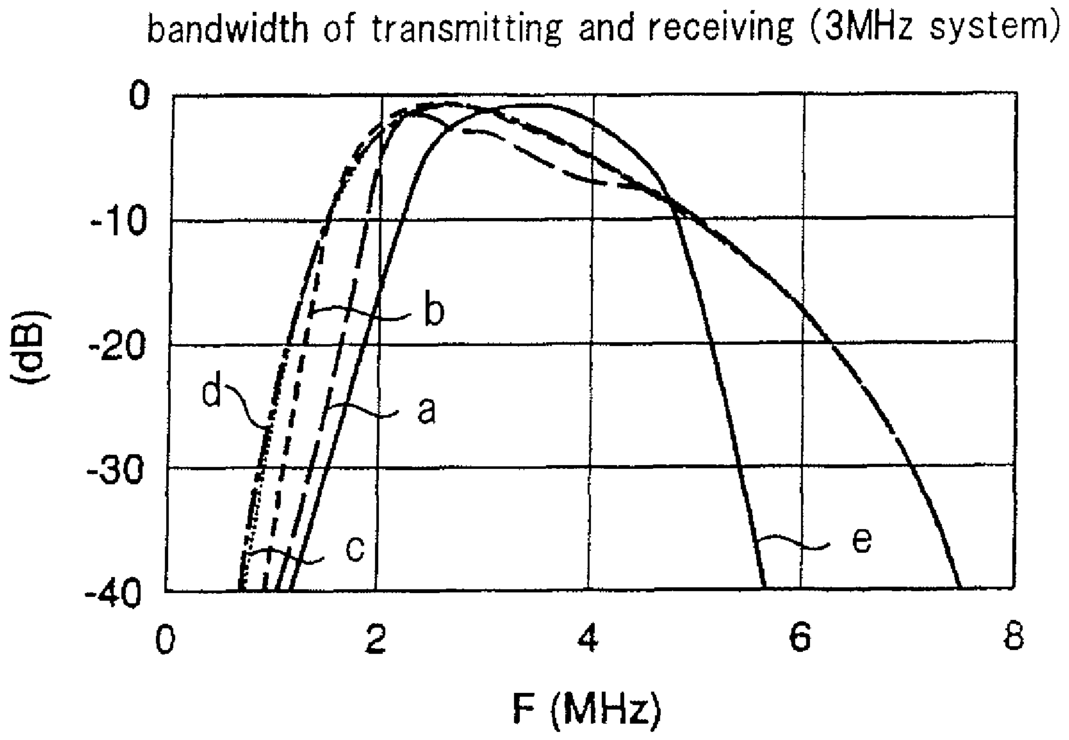
FIG. 8 is a graph indicating waveforms of transmitting and receiving in the case of usage of the 3 MHz ultrasonic probe of the first exemplary embodiment of an acoustic matching layer.

In FIG. 8, curve a is a frequency bandwidth in the case that the thickness of the slope matching layer is 500 Φm; a curve b is a frequency bandwidth in the case that thickness of the slope matching layer is 1500 Φm; curve C is a frequency bandwidth in the case that thickness of the slope matching layer is 2000 Φm; and curve d is a frequency bandwidth in the case of double matching layers.

As shown in FIG. 8, in the case of a 3 MHz ultrasonic probe including a slope matching layer, it is recognized that when thickness of the slope matching layer is thin, the frequency bandwidth of the transmitted ultrasonic waves is narrower.

Figure 9:
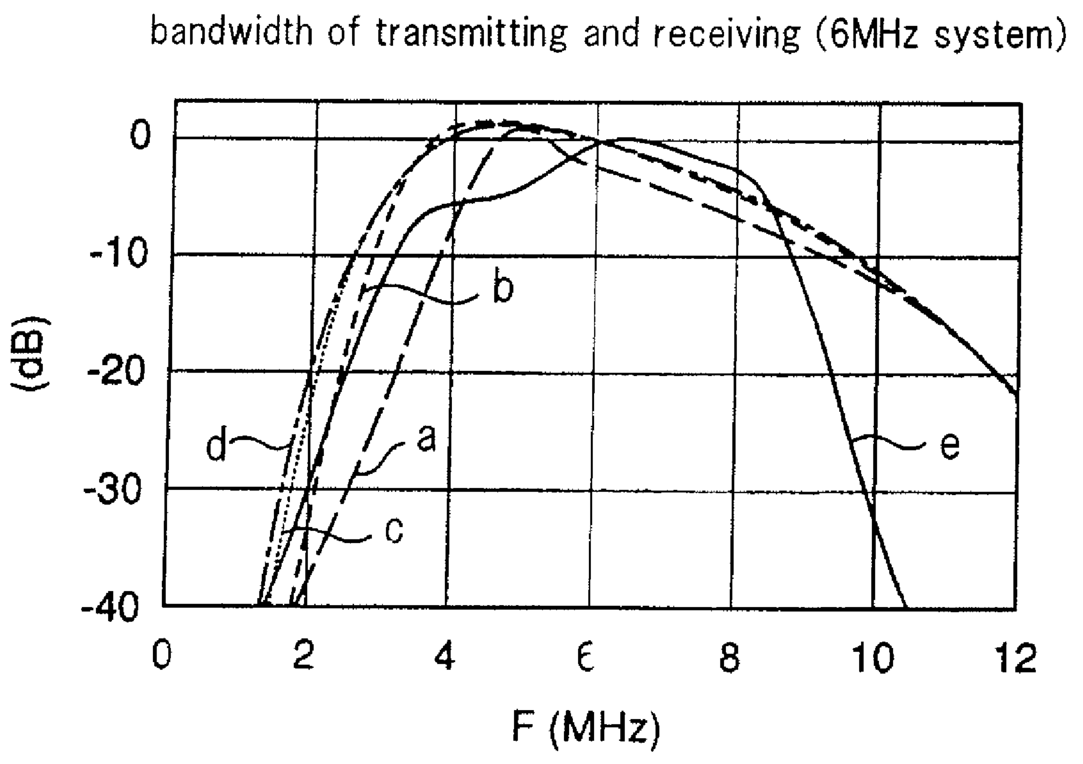
FIG. 9 is a graph indicating waveforms of transmitting and receiving in the case of usage of the 6 MHz ultrasonic probe of the first exemplary embodiment of an acoustic matching layer.

In FIG. 9, curve a is a frequency bandwidth in the case that thickness of the slope matching layer is 200 Φm; curve b is a frequency bandwidth in the case that thickness of the slope matching layer is 600 Φm; curve C is a frequency bandwidth in the case that thickness of the slope matching layer is 800 Φm; and curve d is a frequency bandwidth in the case of double matching layers.

As shown in FIG. 9, in the case of a 6 MHz ultrasonic probe including a slope matching layer, it is recognized that when thickness of a slope matching layer is thin, the frequency bandwidth of transmitted ultrasonic waves is narrower.

Next, in the case of the 3 MHz ultrasonic probe, it is considered that there is a relation between thickness d of a acoustic matching layer 223 and the frequency bandwidth of transmit ultrasonic waves.

Figure 6:
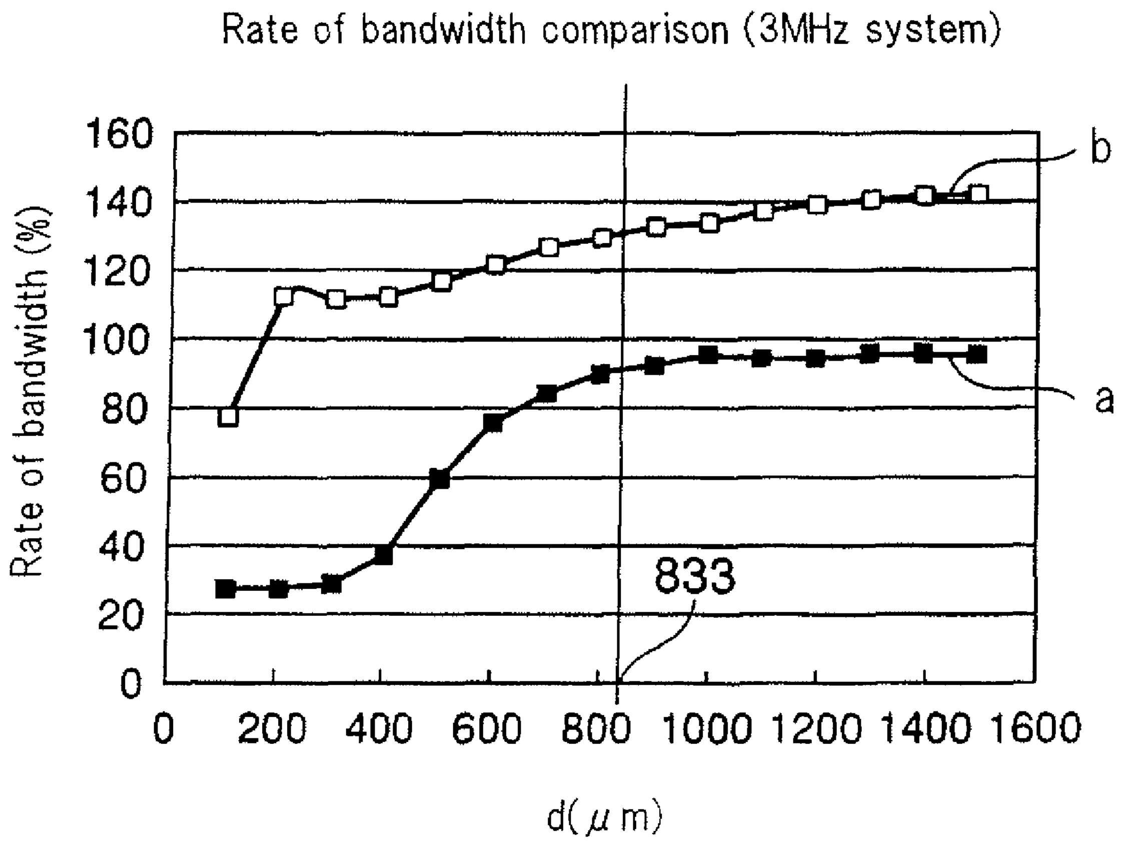
FIG. 6 is a graph indicating simulation result of rate of bandwidths of transmitting and receiving in the case of usage of the 3 MHz ultrasonic probe of the first exemplary embodiment of an acoustic matching layer.

In FIG. 6, the abscissa axis is the thickness d of the acoustic matching layer 223, and the ordinate axis is the rate of bandwidth of transmitting and receiving of transmitting waves. The curve a indicates the case that bandwidth is −6 dB, and the curve b indicates the case that bandwidth is −20 dB.

In the case of a 3 MHz ultrasonic probe, if sonic speed of the piezoelectric vibrator 221 is 400 m/s and sonic speed of the acoustic lens 222 is 1000 m/s, the average wavelength of ultrasonic waves is 833 Φm.

As shown in FIG. 6, when the thickness d of the acoustic matching layer 223 is larger than 833 Φm, the rate of bandwidths of transmitting and receiving of ultrasonic waves is larger. In contrast, when thickness d of the acoustic matching layer 223 is less than 833 Φm, the rate of bandwidths of transmitting and receiving of ultrasonic waves decreases sharply. In the case of the 3 MHz ultrasonic probe, it is recognized that average wavelength of ultrasonic waves propagating in the acoustic matching layer 223 is a border between large and small rate of bandwidths of transmitting and receiving of ultrasonic waves.

Next, in the case of a 3 MHz ultrasonic probe, it is considered that there is a relation between thickness d of the acoustic matching layer 223 and rate of bandwidth of transmitting and receiving of ultrasonic waves.

Figure 7:
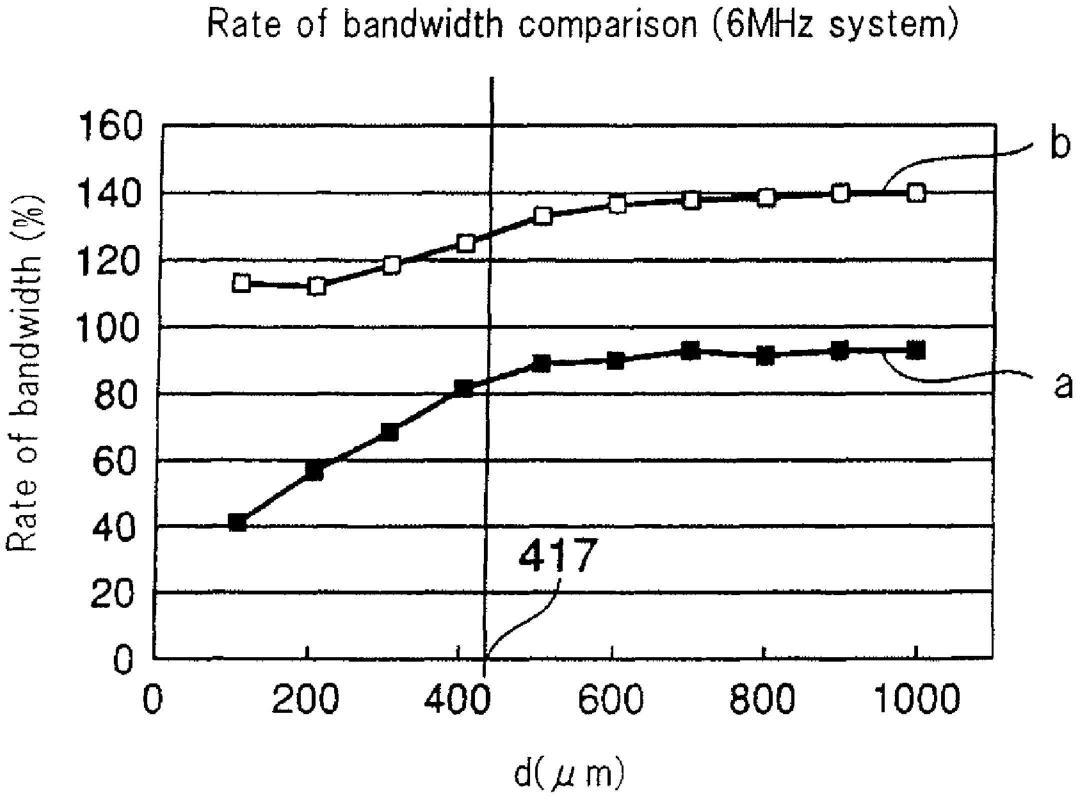
FIG. 7 is a graph indicating simulation result of rate of bandwidths of transmitting and receiving in the case of usage of the 6 MHz ultrasonic probe of the first exemplary embodiment of an acoustic matching layer.

In FIG. 7, the abscissa axis is thickness d of the acoustic matching layer 223, and the ordinate axis is rate of bandwidth of transmitting and receiving. The curve a indicates the case that bandwidth is −6 dB, and the curve b indicates the case that bandwidth is −20 dB.

In the case of 6 MHz ultrasonic probe, if the sonic speed of the piezoelectric vibrator 221 is 400 m/s and the sonic speed of the acoustic lens 222 is 1000 m/s, the average wave length of ultrasonic wave is 417 Φm.

As shown in FIG. 7, when the thickness d of the acoustic matching layer 223 is larger than 417 Φm, the rate of bandwidths of transmitting and receiving of ultrasonic waves is larger. In contrast, when thickness d of the acoustic matching layer 223 is less than 417 Φm, the rate of bandwidths of transmitting and receiving of ultrasonic waves decreases sharply. In the case of 6 MHz ultrasonic probe, it is recognized that average wave length of ultrasonic waves propagating in the acoustic matching layer 223 is a border between large and small rate of bandwidths of transmitting and receiving of ultrasonic waves.

On the basis for the above discussed results of simulation, it is substantiated that when thickness d of acoustic matching layer 223 is larger than the average wavelength, the rate of bandwidth of transmitting and receiving of ultrasonic waves is larger and when thickness d of acoustic matching layer 223 is smaller than the average wavelength, the rate of bandwidths of transmitting and receiving of ultrasonic wave decreases.

(Manufacturing Process of the Transducer 22)

At first, n plastic films are laminated on the front surface of the piezoelectric vibrator 221 fixed in a mold. The filler is added into the plastic films in advance. Then, the mold is pressed by press machine, so that laminated n plastic films are pressed by large pressure. In this way, n plastic films, the acoustic matching layers 223 including the first to nth matching layers 223(1) to 223(n), are fixed on the front surface. On the back surface of the piezoelectric vibrator 221, the backing material 224 is fixed. This block is configured by the piezoelectric vibrator 221, the acoustic matching layers 223 and the backing material 224 and is diced along scan direction. The acoustic lens 222 is fastened on the front surface of the block, and the transducer 22 is completed.

In addition, in this exemplary embodiment, filler is previously added into the plastic film. However, similar effects are obtained by a method in which filler is added between the plastic films.

Furthermore, the added filler may be same kind of filler. However, each of the plastic films may includes different kinds of filler.

Affect of this Exemplary Embodiment

Acoustic impedance of the acoustic matching layer 223 changes smoothly from the piezoelectric vibrator 221 toward the acoustic lens 222. As a result, because no discontinuous face exists in the acoustic matching layer 223, reflection of ultrasonic waves selected from discontinuity in acoustic impedance decreases.

Furthermore, rate of change of acoustic impedance of the acoustic matching layer 223 approaches zero toward the end of the layer. As a result, at a border portion between the acoustic matching layer 223 and the piezoelectric vibrator 221 and a border portion between the acoustic matching layer 223 and the acoustic lens 222, acoustic impedance hardly changes, rate of change of acoustic impedance of the acoustic matching layer 223 is continuous, and reflection of ultrasonic waves resulting from discontinuous rate of change of acoustic impedance decreases.

In the above explanation of this exemplary embodiment, because reflection of ultrasonic waves decreases, efficiency of propagation of ultrasonic waves is improved, obtained ultrasonic images become clearer, and image diagnostics are improved.

Figure 10:
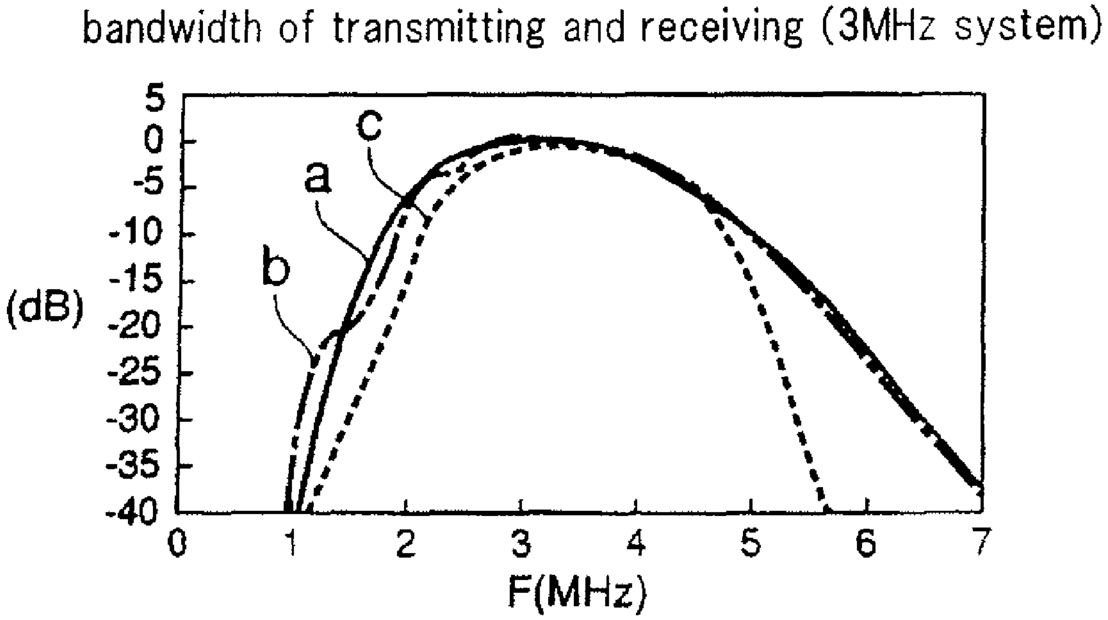
FIG. 10 is a graph indicating waveforms of transmitting and receiving in the case of usage of the ultrasonic probe of the first exemplary embodiment of an acoustic matching layer.
Figure 11:
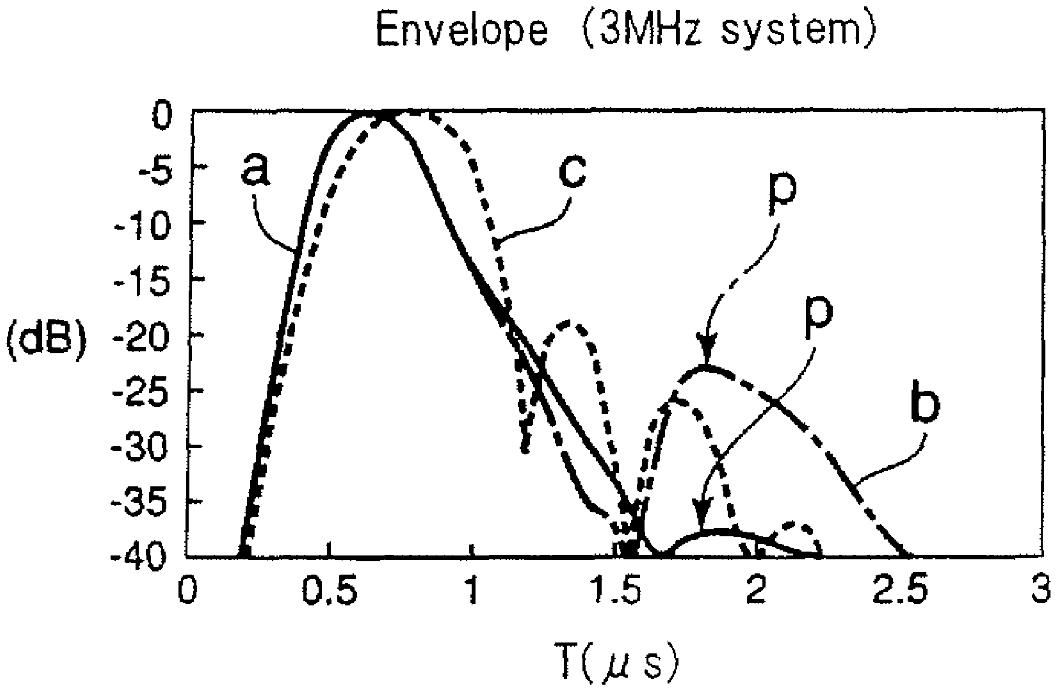
FIG. 11 is a graph indicating envelopes of transmitting and receiving in the case of usage of the ultrasonic probe of the first exemplary embodiment of an acoustic matching layer.

In FIG. 10 and FIG. 11, an abscissa axis is frequency and an ordinate axis is acoustic pressure. Curve a is a case of this exemplary embodiment, curve b is a case of a prior ultrasonic probe including a slope acoustic matching layer, and curve C is a case of a prior ultrasonic probe including two matching layers. In each of these cases the transmitting frequency is 3 MHz.

As shown in FIG. 10, the frequency bandwidth of transmitting ultrasonic wave is four percent wider at −6 dB and seven percent wider at −20 dB. Therefore because of usage of ultrasonic probe of this exemplary embodiment, the frequency bandwidth of transmitting ultrasonic wave becomes wider.

As shown in FIG. 11, a second peak P of frequency bandwidth is about 15 dB lower than that of the prior ultrasonic probe including a slope matching layer. Therefore because of usage of the ultrasonic probe of this exemplary embodiment, it is recognized that stypticity of ultrasonic waves is progressed.

As mentioned above, for the result of the simulation, because of usage of the ultrasonic probe of this exemplary embodiment, it is seen that propagation characteristics of ultrasonic waves are improved.

In the other hand, the acoustic matching layer 223 is configured from the first to nth matching layers 223(1) to 223(n) so that thickness of each is about a fortieth part of the wavelength of ultrasonic waves. Therefore, it can be assumed that acoustic impedance of the acoustic matching layer 223 is changing continuously.

Furthermore, the thickness d of the acoustic matching layer 223 of this exemplary embodiment is less than the average wavelength of ultrasonic waves propagating in the acoustic matching layer 223. Therefore, it is seen that frequency bandwidth of transmitting ultrasonic waves becomes wider, and that ultrasonic diagnostics is improved.

In addition, a large thickness d of the acoustic matching layer 223 is not always beneficial for characteristics of ultrasonic waves. As shown in FIG. 10 and FIG. 11, when the thickness d of the acoustic matching layer 223 becomes larger than 1000 Φm, wider frequency bandwidth is plateaued. Therefore thickness d of the acoustic matching layer 223 must be set according to the rate of decrease and wider frequency bandwidth.

Second Exemplary Embodiment

Figure 12:
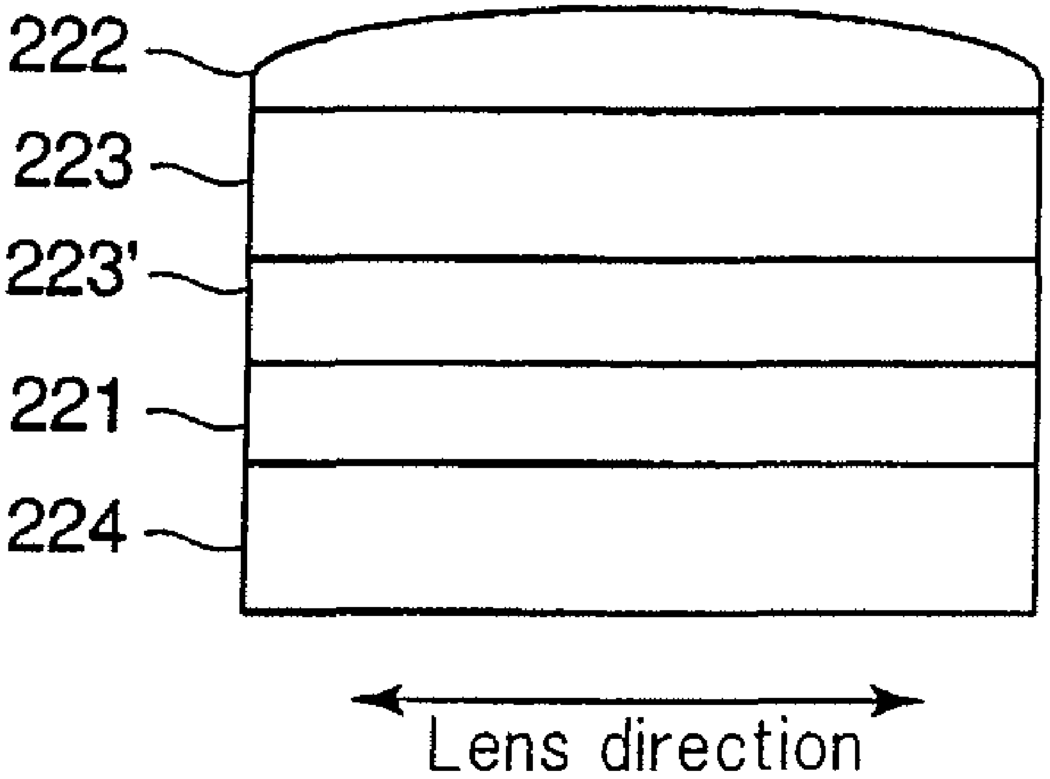
FIG. 12 is an elevation view of the transducer of a second exemplary embodiment.

As shown in FIG. 12, the transducer 22 of this second exemplary embodiment includes a sub acoustic matching layer 223' between the piezoelectric vibrator 221 and the acoustic matching layer 223. In other words, the transducer 22 of this exemplary embodiment includes two matching layers.

The acoustic impedance of the sub acoustic matching layer 223' is about 12 Mraly. The acoustic impedance of the end contacting the sub acoustic matching layer 223' of the acoustic matching layer 223 is 12 Mraly, which is the same as that of the sub acoustic matching layer 223'.

In this component, at a border portion between the acoustic matching layer 223 and the sub acoustic matching layer 223' and a border portion between the acoustic matching layer 223 and the acoustic lens 222, acoustic impedance hardly changes. Therefore, because reflection of ultrasonic waves decreases, efficiency of propagation of ultrasonic waves is improved.

Furthermore, the acoustic matching layer 223 becomes thinner by the thickness of the sub acoustic matching layer 223', a number of fixing required for manufacturing the acoustic matching layer 223 is decreased. As a result, manufacturing of transducer 22 becomes easier.

Third Exemplary Embodiment

Figure 13:
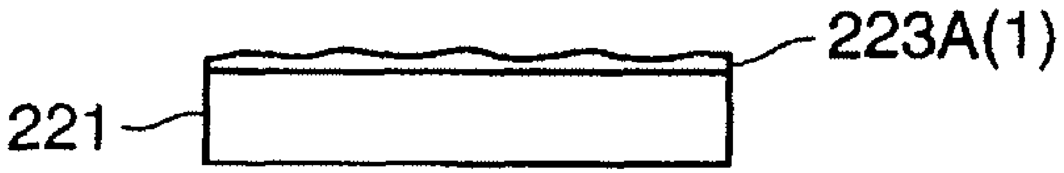
FIG. 13 is explanation view of a manufacturing process of an acoustic matching layer of a third exemplary embodiment of the invention.
Figure 13:
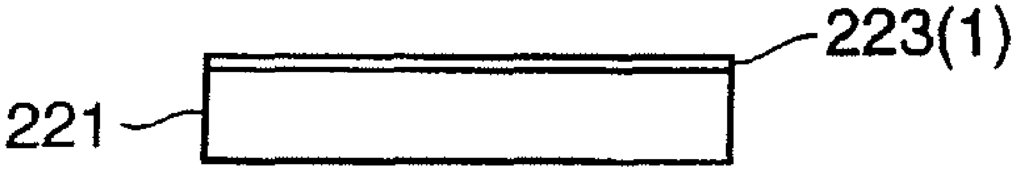
Figure 13:
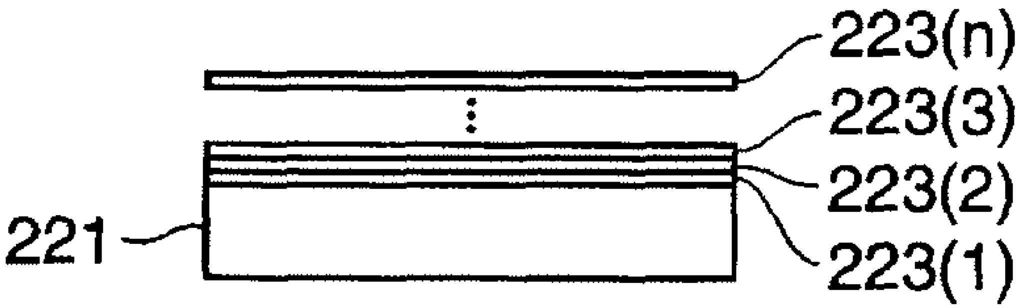
Figure 14A:
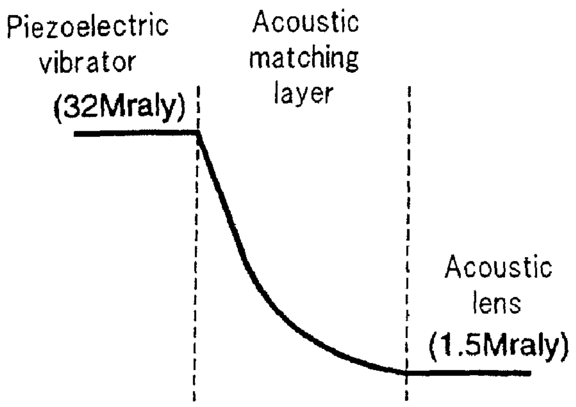
FIGS. 14(*a*) and 14(*b*) are schematic views of the change of acoustic impedance from a piezoelectric vibrator toward an acoustic lens of the prior art.
Figure 14B:
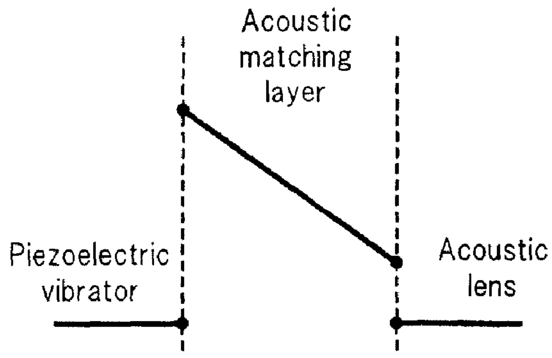

As shown by FIG. 13, in a manufacturing process of the transducer 22 of this exemplary embodiment, at first, as shown by FIG. 13(*a*), liquid of first plastic 223A(1) is coated on a front surface of the piezoelectric vibrator 221. The acoustic impedance of the first plastic 223A(1) is the same as that of the first matching layer 221. The acoustic impedance of first plastic 223A(1) is dependent on addition of filler, for example, made from silica powder or tungsten powder. After hardening of the first plastic 223A(1), as shown in FIG. 13(*b*), the first plastic 223A(1) is grinded so as to have predetermined thickness. As a result, the first matching layer 223(1) is formed on the front surface of the piezoelectric vibrator 221. The thickness of the first matching layer 223(1) is less than a fortieth part of wavelength of ultrasonic waves, as in the first exemplary embodiment.

In a similar manner, the second matching layer 223(2), the third matching layer 223(3) . . . and the nth matching layer 223 (n) are formed sequentially. As shown in FIG. 13(*c*), the acoustic matching layer 223 configured from the first matching layer 223(1), the second matching layer 223(2), the third matching layer 223(3) . . . and the nth matching layer 223(n) is formed on the front surface of the piezoelectric vibrator 221. The acoustic lens is then fastened on the front surface of the acoustic matching layer 223 and the transducer 22 is completed.

This manufacturing process can be used to fabricate the transducer 22 of the first exemplary embodiment. In addition, because it is not necessary to consider thickness of bonding, manufacturing becomes easier.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed:

1. An ultrasonic probe comprising:

a piezoelectric vibrator including a piezoelectric material and configured to transmit and receive ultrasonic waves;

an acoustic lens configured to focus the ultrasonic waves; and an acoustic matching layer arranged between the piezoelectric vibrator and the acoustic lens and configured to modify acoustic impedance from the piezoelectric vibrator to the acoustic lens, comprising, a first region arranged at center areas along a direction of transmitting and receiving of the ultrasonic waves, a second region arranged between the first region and the piezoelectric vibrator and having a rate of change of acoustic impedance less than a rate of change of acoustic impedance of the first region, and a third region arranged between the first region and the acoustic lens and having a rate of change of acoustic impedance less than a rate of change of acoustic impedance of the first region, the acoustic matching layer having a thickness along said direction that is larger than an average wavelength of ultrasonic waves propagating in the acoustic matching layer, and the acoustic matching layer excluding the piezoelectric material of the piezoelectric vibrator.

2. The ultrasonic probe according to claim 1, wherein:

the acoustic matching layer has a rate of change of acoustic impedance steadily decreasing toward the piezoelectric vibrator or the acoustic lens.

3. The ultrasonic probe according to claim 1, wherein:

the average wavelength is based on average speeds of ultrasonic waves propagating in both ends of the acoustic matching layer along said direction and the frequency of the ultrasonic waves propagating in the acoustic matching layer.

4. The ultrasonic probe according to claim 1, wherein:

the acoustic matching layer is configured so that an acoustic impedance at a border region with the acoustic lens and a border region with the piezoelectric vibrator respectively correspond to the acoustic impedances of the acoustic lens and piezoelectric vibrator.

5. The ultrasonic probe according to claim 1, wherein the acoustic matching layer comprises:

a plurality of films layered along said direction, each film having a thickness less than a fortieth part of the wavelength of ultrasonic waves.

6. The ultrasonic probe according to claim 5, wherein:

the films are made from plastic.

7. The ultrasonic probe according to claim 5, wherein:

the films include filler for modifying acoustic impedance of the films.

8. The ultrasonic probe according to claim 5, wherein the acoustic matching layer is formed by repetition of:

coating liquid plastic on a front side of the piezoelectric vibrator;

solidifying the plastic; and grinding the plastic to form the film.

9. An ultrasonic probe comprising:

a piezoelectric vibrator including a piezoelectric material and configured to transmit and receive ultrasonic waves;

an acoustic lens configured to focus the ultrasonic waves; and an acoustic matching layer arranged between the piezoelectric vibrator and the acoustic lens and configured to modify acoustic impedance from the piezoelectric vibrator to the acoustic lens; wherein the piezoelectric vibrator, the acoustic lens and the acoustic matching layer have acoustic impedances which change in accordance with a continuously differentiable function along a direction of transmitting and receiving of the ultrasonic waves, and the acoustic matching layer having a thickness along said direction that is larger than an average wavelength of ultrasonic waves propagating in the acoustic matching layer, and the acoustic matching layer excluding the piezoelectric material of the piezoelectric vibrator.

10. An ultrasonic probe comprising:

a piezoelectric vibrator including a piezoelectric material and configured to transmit and receive ultrasonic waves;

an acoustic lens configured to focus the ultrasonic waves; and an acoustic matching layer arranged between the piezoelectric vibrator and the acoustic lens and configured to modify acoustic impedance from the piezoelectric vibrator to the acoustic lens; wherein the acoustic matching layer has a thickness along a direction of transmitting and receiving of the ultrasonic waves which is larger than an average wavelength of ultrasonic waves propagating in the acoustic matching layer, and the acoustic matching layer excluding the piezoelectric material of the piezoelectric vibrator.

11. An ultrasonic diagnostic apparatus comprising:

an ultrasonic probe configured to transmit and receive ultrasonic waves toward and from a subject;

a transmitting and receiving circuit configured to generate reception signals on the basis of refracted signals received by the ultrasonic probe; and an image generation unit configured to generate a image related to the subject on the basis of reception signals generated by the transmitting and receiving circuit;

wherein the ultrasonic probe comprising, a piezoelectric vibrator including a piezoelectric material and configured to transmit and receive ultrasonic waves, an acoustic lens configured to focus the ultrasonic waves, and an acoustic matching layer arranged between the piezoelectric vibrator and the acoustic lens and configured to modify an acoustic impedance from the piezoelectric vibrator to the acoustic lens;

wherein the acoustic matching layer comprises, a first region arranged at center areas along a direction of transmitting and receiving of the ultrasonic waves, a second region arranged between the first region and the piezoelectric vibrator and having a rate of change of acoustic impedance less than a rate of change of acoustic impedance of the first region; and a third region arranged between the first region and the acoustic lens and having a rate of change of acoustic impedance less than a rate of change of acoustic impedance of the first region, the acoustic matching layer having a thickness along said direction that is larger than an average wavelength of ultrasonic waves propagating in the acoustic matching layer, and the acoustic matching layer excluding the piezoelectric material of the piezoelectric vibrator.

12. An ultrasonic diagnostic apparatus comprising:

an ultrasonic probe configured to transmit and receive ultrasonic waves toward and from a subject;

a transmitting and receiving circuit configured to generate reception signals on the basis of reflected signals received by the ultrasonic probe; and an image generation unit configured to generate a image related to the subject on the basis of reception signals generated by the transmitting and receiving circuit;

wherein the ultrasonic probe comprises, a piezoelectric vibrator including a piezoelectric material and configured to transmit and receive ultrasonic waves, an acoustic lens configured to focus the ultrasonic waves, and an acoustic matching layer arranged between the piezoelectric vibrator and the acoustic lens and configured to modify acoustic impedance from the piezoelectric vibrator to the acoustic lens;

wherein the acoustic matching layer has a thickness along a direction of transmitting and receiving of the ultrasonic waves which is larger than an average wavelength of ultrasonic waves propagating in the acoustic matching layer, and the acoustic matching layer excluding the piezoelectric material of the piezoelectric vibrator.

13. The ultrasonic probe according to claim 1, wherein the acoustic lens comprises:

a curved surface for contacting to an object exposed to the ultrasonic waves.

14. The ultrasonic probe according to claim 1, wherein the acoustic lens has an acoustic impedance matched to an acoustic impedance of said object.

15. The ultrasonic probe according to claim 1, wherein the acoustic matching layer has an impedance which changes continuously in said direction.

* * * * *